United States Patent [19]
Veal et al.

[11] Patent Number: 5,869,431
[45] Date of Patent: Feb. 9, 1999

[54] THIN FILM SEEDS FOR MELT PROCESSING TEXTURED SUPERCONDUCTORS FOR PRACTICAL APPLICATIONS

[75] Inventors: Boyd W. Veal; Arvydas Paulikas, both of Downers Grove; Uthamalingam Balachandran, Hinsdale, all of Ill.; Wei Zhong, West Lafayette, Ind.

[73] Assignee: The University of Chicago, Chicago, Ill.

[21] Appl. No.: 632,549

[22] Filed: Apr. 15, 1996

[51] Int. Cl.$^6$ ...................................................... H01L 39/00
[52] U.S. Cl. ........................ 505/234; 505/126; 505/450; 505/451; 505/733; 505/780; 427/62
[58] Field of Search ..................................... 505/450, 451, 505/234, 729, 780, 733, 126, 238; 427/62, 63

[56] References Cited

U.S. PATENT DOCUMENTS 5,308,799  5/1994  Morita et al. ............................ 505/126

OTHER PUBLICATIONS

Todt, Journal of Electronic Materials, vol. 23, No. 11, 1994, pp. 1127–1130.

Badaye et al, Appl. Phys. Lett. 66(16) Apr. 1995, pp. 2131–2133.

*Primary Examiner*—Roy V. King
*Attorney, Agent, or Firm*—Emrich & Dithmar

[57] ABSTRACT

A method of fabricating bulk superconducting material such as $RBa_2Cu_3O_{7-\delta}$ where R is La or Y comprising depositing a thin epitaxially oriented film of Nd or Sm (123) on an oxide substrate. The powder oxides of $RBa_2Cu_3O_{7-\delta}$ or oxides and/or carbonates of R and Ba and Cu present in mole ratios to form $RBa_2Cu_3O_{7-\delta}$, where R is Y or La are heated, in physical contact with the thin film of Nd or Sm (123) on the oxide substrate to a temperature sufficient to form a liquid phase in the oxide or carbonate mixture while maintaining the thin film solid to grow a large single domain 123 superconducting material. Then the material is cooled. The thin film is between 200 Å and 2000 Å. A construction prepared by the method is also disclosed.

12 Claims, No Drawings

THIN FILM SEEDS FOR MELT PROCESSING TEXTURED SUPERCONDUCTORS FOR PRACTICAL APPLICATIONS

CONTRACTUAL ORIGIN OF THE INVENTION

The United States Government has rights in this invention pursuant to Contract No. W-31-109-ENG-38 between the U.S. Department of Energy (DOE) and The University of Chicago representing Argonne National Laboratory.

BACKGROUND OF THE INVENTION

This invention relates to a process of using "seed crystals" for growing highly textured bulk quantities of superconductors such as single large domain $RBa_2Cu_3O_{7-\delta}$ where R is a rare earth, La or Y. More specifically, the invention relates to melt processing high $T_c$ superconductors using seed crystals of lower cost but significantly larger surface area than previously available. The seed materials are a laminate of an oxide compound such as, for instance, $SrTiO_3$, $LaAlO_3$, or the like, which have high melting or decomposition temperatures above those of the high $T_c$ superconductors but are readily available and of low cost and which are not $T_c$ superconductors themselves onto which is deposited a thin film of $NdBa_2CuO_{7-\delta}$ or $SmBa_2CuO_{7-\delta}$.

Large single domains of $YBa_2Cu_3O_{7-\delta}$, materials show high levitation forces because of their size and because of their good flux-pinning strength due to large numbers of small pinning sites. The materials show promise in practical applications requiring levitation or high magnetic fields, such as fly wheels for energy storage, high field magnets, magnetic resonance imaging and efficient electric generators. Previously, $SmBa_2Cu_3O_x$ as well as $Nd_{1+x}Ba_{2-x}Cu_3O_y$ have been used as the seeding material during the melt-growth process in making large single domain 123 material ($YBa_2Cu_3O_x$).

More particularly, $SmBa_2Cu_3O_x$ (Sm 123) had been used, but this material has a serious defect in that Sm 123 has only a slightly higher melting point than the bulk (YBCO) 123 material and, therefore, the seeds of Sm 123 often melt during the process. This is undesirable, since the purpose of the seeding material is to provide solid particles to facilitate the crystallization of the melted 123 material during the melt-forming process.

It has been found that Nd 123 forms a solid solution in the form of $Nd_{1+x}Ba_{2-x}Cu_3O_y$ and was previously thought to be unsatisfactory as a seed material, but a co-pending patent application Ser. No. 371,931 filed Jan. 12, 1995, now abandoned, assigned to the assignee herein, the disclosure of which is herein incorporated by reference, teaches the use of the Nd 123 material as a seed for preparing bulk superconducting material.

The problem encountered in using either the Sm or Nd 123 materials as seeds is that both of these materials are expensive to produce as single crystals and only relatively small crystals have been able to be made. These problems limit the use of the Nd 123 material even though the Nd 123 material is particularly advantageous because of its relatively high melting temperature compared to the melting temperature of bulk superconductor being prepared so that the Nd 123 material does not melt during the high temperature processing of the $RBa_2Cu_3O_x$ material.

It has been found that large surface area Nd 123 or SM 123 seeding material can be made inexpensively with suitable inexpensive with suitable readily available substrate materials such that large domain material can be prepared by using the Nd 123 or Sm 123 as thin films in combination with cheaper oxides as substrate materials. The thin films Nd 123 or Sm 123 can be deposited on the oxide substrate with any conventional deposition technique. The advantage of the present invention is that large surface area Nd 123 or Sm 123 can be made at low cost to provide seed material to make large single domain R 123 superconductors, where R is La or Y.

SUMMARY OF THE INVENTION

Accordingly, an object of the present invention is to provide a method of making large single domain 123 material by using relatively inexpensive, commercially available oxide materials as substrates for thin film Nd 123 or Sm 123.

Another object of the invention is to provide a method of making single domain or highly textured bulk quantities of superconductors using a seed crystal which has a surface area of several $Cm^2$.

The invention consists of certain novel features hereinafter fully described and particularly pointed out in the appended claims, it being understood that various changes in the details may be made without departing from the spirit, or sacrificing any of the advantages of the present invention.

DESCRIPTION OF THE PREFERRED EMBODIMENT

Our invention consists of the use of commercially available inexpensive materials as substrates for seeds for precipitation such as by melt-processing textured high temperature superconductors. $SrTiO_3$, $LaAlO_3$ and cubic stabilized $ZrO_2$ (i.e. $ZrO_2$ containing a divalent or trivalent dopant such as Ca or Y to stabilize the cubic phase) are acceptable substrates, as are others to be hereinafter set forth. The seed crystal comprising the substrate and a thin film of Nd or Sm (123 material), that is R $Ba_2Cu_3O_{7-\delta}$ where R is Nd or Sm or mixtures thereof is used as a nucleation center for growing single crystals (or textured material) of $RBa_2Cu_3O_{7-\delta}$ (RBCO) where R is La or Y of large size. The advantage of this invention is that the single crystals need not be larger than the seed crystal. Rather, the seed crystal can be made very large (multiple $Cm^2$) and the superconducting material can be, if desired, approximately coextensive with the underlying seed. This is a significant advance over the prior art because the seed material here disclosed is rather inexpensive to make, hence permitting an economical process for making large area, single domain superconductor materials, while the prior art was limited to relatively small seeds due to expense.

For YBCO, growth and texturing occurs at approximately 1000° C., where YBCO has the tetragonal structure with a-axis lattice parameter 3.904 Å (in air). It is desirable that the seed material be cubic or tetragonal with an a-axis parameter near 3.9 Å at 1000° C., or orthorhombic with a, b parameters, both of which are close to 3.9 Å at 1000° C.

Seeding material used in the present invention is a rare earth $REBa_2Cu_3O_x$ material (RE 123). The seeding material preferably is one using either Sm or Nd or mixtures thereof with Nd being preferred, notwithstanding the fact that it forms a solid solution unlike Sm and certain other rare earths. Nd123 has a higher melting point than SM123 by about 15° C., and can be used as a seed material for Sm 123 as well as Y 123 or La 123. It is believed that certain combinations of SM and Nd may be used in a satisfactory manner. However, the use of the solid solution $Nd_{1+x}Ba_{2-x}Cu_3O_{7-67}$, wherein y is between 6 and 7, is a viable material and permits the use of a solid-liquid-melt growth (SLMG) process with a temperature gradient in the furnace of up to about 30° C./cm, which if parallel to the C axis of the single domain material supports and enhances the directional solidification of the 123 material. Such a process is disclosed in the Todt et al. U.S. patent application Ser. No. 08/371,931, the disclosure of which is herein incorporated by reference as is the disclosure of the Veal et al. application Ser. No. 08/531,399, filed Sep. 21, 1996, now U.S. Pat. No. 5,611,854.

Single crystals of the seed material may be produced by providing oxide or carbonate sources of the rare earth barium and copper in quantities for the RE $Ba_2Cu_3O_x$ seed crystal. However, barium and copper are preferably present in excess of that required for the final crystals. Various methods may be used to deposit the thin epitaxially oriented Nd or Sm film seed materials on the large oxide substrates, including but not limited to, laser deposition and sputtering. By thin films of Nd or Sm 123 we mean from about 200 to about 2000 Å.

The slowest and most expensive method of depositing thin, epitaxially oriented films on the oxide substrates is the SLMG method in which the oxides and/or carbonates are ground and calcined to form powders which are thereafter heated to a temperature in excess of about 1000° C. and more particularly to a temperature of about 1100° C. to form a molten flux which is rich in both barium and copper. The molten flux is slowly cooled at a range of from about 1° C./hr to about 10° C. per hour until single crystals of the RE $Ba_2Cu_3O_x$ are formed along with flux material. Thereafter, the mixture of single crystals $REBa_2Cu_3O_x$ and flux is quenched from about 1020° C. to 970° C. and then transferred onto a suitable oxide substrate which may be, for instance those set forth for purposes of example only in Table 1. Thereafter, the material is then again heated to a temperature above the melting point of the flux which is about 950° C. but below the melting point of the crystals which in the case of $Nd_{1+x}Ba_{2-x}Cu_3O_y$ is 1070° C. in the presence of a porous oxide substrate material which is unreactive with the seed crystal in order to wick away the flux leaving the crystals more readily available for recovery.

Materials (ceramic oxides) which have suitable characteristics as seed materials according to the invention are set forth in the table below.

TABLE 1

| Seed Material | Crystal Symmetry | Lattice Pars. @ 20° C. (in Å) | Pars. @ 1000° C. (in Å) |
|---|---|---|---|
| $SrTiO_3$ | cubic | 3.904 | 3.938 |
| $LaAlO_3$ | rhombohedral (RT) | 3.188 | 3.826 |
| $PbTiO_3$ | tetragonal | 3.896 Å | |
| $Sr_2RuO_4$ | tetragonal | 3.87 Å | |
| $NdGaO_3$ | Orthorhombic | a = 5.426, b = 5.502 | |
| $LaCrO_3$ | Orthorhombic | a = 5.477, b = 5.514 | |
| $NdCrO_3$ | Orthorhombic | a = 5.412, b = 5.494 | |
| $LaFeO_3$ | Orthorhombic | a = 5.556, b = 5.514 | |
| $NdFeO_3$ | Orthorhombic | a = 5.441, b = 5.573 | |
| $La_2CuO_4$ | Orthorhombic | 3.80 | |

Although $PbTiO_3$ is shown in the Table, other perovskites of the form $RTiO_3$, when R is La or a rare earth are good candidates. $EuTiO_3$, $NdGaO_3$, and other perovskite-like oxides with the prototype $GdFeO_3$ structure should also serve well. $NdGaO_3$ is available as a commercial substrate material. Others may also be commercially available, particularly $LaCrO_3$ which has many industrial applications.

Oxides with the $GdFeO_3$ ($ABO_3$) structure are similar to the perovskites and can be viewed as an assembly of four perovskite cells, all of which may be suitable substrates.

The Nd 123, Sm 123 or mixtures thereof are prepared in the usual way and deposited on the oxide substrate by any suitable method, preferably by the cheapest and quickest method. As before stated sputtering or laser deposition techniques are acceptable, as are others not specifically identified herein.

To the extent that it is desirable to produce bulk superconductivity materials that are mixtures of Y 123 and minor amounts of Y 211 ($Y_2BaCuO_5$), they can easily be made by beginning with suitable mixtures of carbonates or oxides of the 211 and 123 precursors, all as taught in the incorporated patent applications, Ser. Nos. 371,931 and 531,399. By minor amounts of 211 material, it is meant less than 50% by weight.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. A method of fabricating bulk superconducting material including $RBa_2Cu_3O_{7-\delta}$ where R is La or Y comprising depositing a thin epitaxially oriented film of Nd or Sm (123) on the surface of an oxide substrate, wherein the oxide substrate is one or more of $SrTiO_3$, $LAAlO_3$, cubic stabilized $ZrO_2$, $PbTiO$, $Sr_2RuO_4$, $NdGaO_3$, $LaCrO_3$, $NdCrO_3$, $LaFeO_3$, $NdFeO_3$,$La_2$ $CuO_4$, $RTiO_3$, where R is La or a rare earth, $GdFeO_3$ and thereafter heating powder oxides of $RBa_2Cu_3O_{7-\delta}$ or oxides and/or carbonates of R and Ba and Cu present in mole ratios to form $RBa_2Cu_3O_{7-\delta}$, where R is Y or La, in physical contact with the thin film of Nd or Sm (123) on the oxide substrate to a temperature sufficient to form a liquid phase in the oxides or oxides and carbonates mixture while maintaining the thin film solid to grow a large single domain 123 superconducting material and thereafter cooling.

2. The method of claim 1, wherein R is La.

3. The method of claim 1, wherein R is Y.

4. The method of claim 1, wherein R is La and the bulk superconductor also contains 211 material.

5. The method of claim 1, wherein the thin film is between about 200 Å and about 2000 Å thick.

6. The method of claim 1, wherein the thin film has an area of at least 1 $cm^2$.

7. The method of claim 1, wherein the thin film has an area up to about 2 $cm^2$.

8. A composite comprising a bulk superconducting material of single domain $RBa_2Cu_3O_{7-\delta}$ where R is La or Y or mixtures thereof on a thin epitaxially oriented film of Nd or Sm (123) or mixtures thereof on a ceramic oxide substrate, wherein the oxide substrate is one or more of Sr $TiO_3$, $LAAlO_3$, cubic stabilized $ZrO_2$, $PbTiO_3$, $Sr_2RuO_4$, Nd $GaO_3$, $LaCrO_3$, $NdCrO_3$, $LaFeO_3$, $NdFeO_3$, $La_2$ $CuO_4$, $RTiO_3$, where R is La or a rare earth and $GdFeO_3$.

9. The composite of claim 8, wherein the bulk superconducting material contains a minor amount of $Y_2BaCuO_5$.

10. The composite of claim 8, wherein the thin film is between about 200 Å and about 2000 Å thick.

11. The composite of claim 8, wherein the thin film has an area of at least 1 $cm^2$.

12. The composite of claim 10, wherein the thin film has an area up to about 2 $cm^2$.

* * * * *

UNITED STATES PATENT AND TRADEMARK OFFICE
CERTIFICATE OF CORRECTION

PATENT NO. : 5,869,431
DATED : February 9, 1999
INVENTOR(S) : Boyd W. Veal, et al.

It is certified that error appears in the above-identified patent and that said Letters Patent is hereby corrected as shown below:

Claim 1, line 29, delete "LAAlO$_3$" and insert --LaAlO$_3$--.
       line 30, delete "PbTiO" and insert --PbTiO$_3$--.

Claim 8, line 56 delete "LAAlO" and insert --LaAlO$_3$--.

Signed and Sealed this

First Day of June, 1999

*Attest:*

*Attesting Officer*

Q. TODD DICKINSON

*Acting Commissioner of Patents and Trademarks*